United States Patent [19]

Ristic et al.

[11] Patent Number: 4,999,692
[45] Date of Patent: Mar. 12, 1991

[54] SEMICONDUCTOR MAGNETIC FIELD SENSOR

[75] Inventors: Ljubisa Ristic, Edmonton, Canada; Heinrich P. Baltes, Zürich, Switzerland; Thomas Smy, Edmonton, Canada

[73] Assignee: The Governors of the University of Alberta, Edmonton, Canada

[21] Appl. No.: 192,770

[22] Filed: May 11, 1988

[30] Foreign Application Priority Data

May 12, 1987 [GB] United Kingdom ............... 8711150

[51] Int. Cl.$^5$ ........................................... H01L 27/22
[52] U.S. Cl. ...................................... 357/27; 357/35; 357/36
[58] Field of Search ........................ 357/27, 35, 36; 324/252

[56] References Cited

U.S. PATENT DOCUMENTS 4,700,211 10/1987 Popovic et al. ................. 357/27

FOREIGN PATENT DOCUMENTS 0131715 1/1985 European Pat. Off. ............ 357/27

Primary Examiner—Andrew J. James
Assistant Examiner—Courtney A. Bowers
Attorney, Agent, or Firm—Sim & McBurney

[57] ABSTRACT

A semiconductor magnetic field sensor has a base region, an emitter which injects minority carriers into the base region along an injection axis, and a collector intersected by the injection axis which collects minority carrier flows. An additional pair of collectors are laterally spaced from the emitter and the injection axis to receive lateral current components arising in the base region from the injected minority carriers. Magnetic fields applied to the base cause a redistribution of the minority carriers between the lateral current components and the strength of the magnetic field can be measured by comparing the magnitudes of the resulting collector currents. Base strips on laterally opposing sides of the emitter form junctions that suppress parasitic lateral injection. Reverse biasing the junctions focuses the injected minority carriers to a greater degree along the injection axis thereby markedly enhancing device sensitivity. Different biasing voltages can be applied to the junctions to shift the injection axis laterally thereby compensating for offsets in the quiescent currents in the two collectors. Base strips spaced outwardly and laterally relative to the pair of collectors permit the quiescent collector currents to be adjusted independent of the biasing voltages applied to the junctions.

14 Claims, 4 Drawing Sheets

W=4μm   $W_B$=8μm   $L_E$=100μm   $W_E$=50μm

SEMICONDUCTOR MAGNETIC FIELD SENSOR

FIELD OF THE INVENTION

The invention relates to semiconductor devices for measuring the intensity of magnetic fields.

DESCRIPTION OF THE PRIOR ART

Solid-state magnetic field sensors are well known. The most common types are Hall cells, magnetodiodes, magnetic field sensitive field effect transistors and magnetotransistors.

The general requirement for high sensitivity favours the magnetotransistor. Such device commonly have an injection region of a particular conductivity type which injects minority carriers into a conduction region of an opposite conductivity type. The minority carrier currents are ultimately received by a plurality of collectors of a conductivity type similar to that of the injection region. The current constituted by the minority carriers is affected by magnetic fields during passage through the conduction channel in such a manner as to cause a redistribution of current flows among the collectors. The changes in collector currents can be sensed to indicate the magnitude of the relevant magnetic field.

The effects creating a redistribution of current flows in response to magnetic fields will be discussed in the context of a magnetotransistor structure comprising an emitter, a base into which the minority carrier are injected from the emitter and two collectors which receive the minority carrier flows. However, the principles involved are not limited to particular transistor geometries. Two basic mechanisms are believed to cause a redistribution of minority carrier current flows among the collectors: deflection of injected carriers into the base region by the Lorentz force and injection modulation (asymmetric injection) caused by a Hall-type voltage built up around the emitter-base junction. The specific structure and the device operating conditions determine the prevailing mechanism. As a result, the relative sensitivity reported hitherto spans from $10^{-2}/T$ to $4/T$, which might be considerably improved. Also, the relationship between the collector currents and intensity of the magnetic field appears to depend on the mechanism causing carrier redistribution, a linear response normally being associated with the deflection mechanism and a non-linear response with the injection modulation mechanism. Non-linear response complicates ultimate measurement and indication of magnetic field intensity and is less desirable.

Magnetotransistor structures are commonly divided into two groups: "vertical" and "lateral" structures. Vertically-structured magnetotransistor base their operation on a vertical minority carrier current component, but parasitic lateral components exists which tend to reduce device sensitivity. Lateral magnetotransistor base their operation on the lateral current components, but in such circumstances the vertical components exists as a parasitic component. Thus, no matter which type of magnetotransistor structure is used non-useful current components exist which detract from device sensitivity.

The present specification describes magnetotransistor structures and features which permit comparatively high sensitivity, sensitivities which in experiments have proven to be as much as $1267\%/T$ or $12/T$.

BRIEF SUMMARY OF THE INVENTION

In one aspect, in a semiconductor device for measurement of magnetic fields by deflection of minority carrier flows in a conduction region, there are provided improved means for injecting minority carriers. The injection means comprise an injection region forming a junction with the conduction region, the injection regions permitting injection of minority carriers into the conduction region along an injection axis extending through the junction. Injection suppressing regions on at least opposing sides of the injection region form junctions having depletion zones which suppress injection of minority carriers laterally relative to the injection axis. Accordingly, parasitic current components are markedly reduced.

The injection region and the injection suppressing regions are preferably engaged by electrical contacts which permit the junctions formed between the injection and injection suppressing regions to be strongly reverse biased so as to focus injection along the injection axis. This tends to confine the injected minority carriers to a narrower path through the conduction region, and enhances the sensitivity of magnetic field detection arrangements which respond essentially to deviation of minority carriers from the injection axis under the influence of magnetic fields.

In another aspect, the invention provides a device for use in measuring the intensity of a magnetic field. The device comprises semiconductor material defining a conduction region, an injection region permitting injection of minority carriers along an injection axis, and injection suppressing regions on at least laterally opposing sides of the injection region. The injection suppressing regions form junctions with the injection region which have depletion zones that suppress injection of minority carriers laterally relative to the injection axis. A plurality of collection regions form junctions with the conduction region where minority carriers can be received. These collection regions are offset laterally from the injection axis such that magnetic field components transverse to the injection axis can redistribute injected minority carrier flows received by plurality of collection regions in response to the magnitude of the magnetic field components.

All regions of such devices may be formed of semiconductor materials which have been doped in a conventional manner to be of conductivity types appropriate for injection, conduction or collection of minority carriers. The injection and collection regions will generally be of a first conductivity type (such as an P or N type regions) and the conduction region will be of an opposite conduction type. The injection suppressing regions will generally be of the same conductivity type as the conduction region except with enhanced conductivity.

Other aspects of the invention including a novel minority carrier injection mechanism will be apparent from a description below of a preferred embodiment and will be defined in the appended claims.

DESCRIPTION OF THE DRAWINGS

The invention will be better understood with reference drawings in which.

Figure 1:
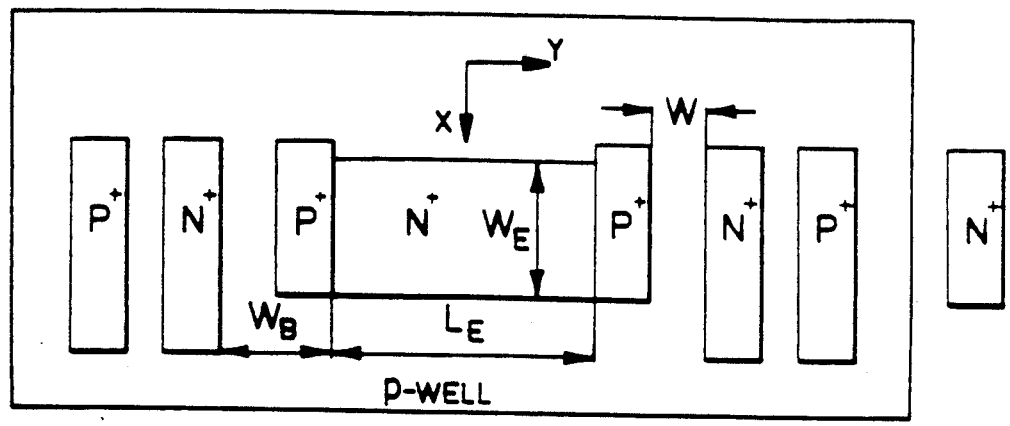
FIG. 1 is a diagrammatic plan view from above of magnetotransistor embodying various aspects of the invention.
Figure 2:
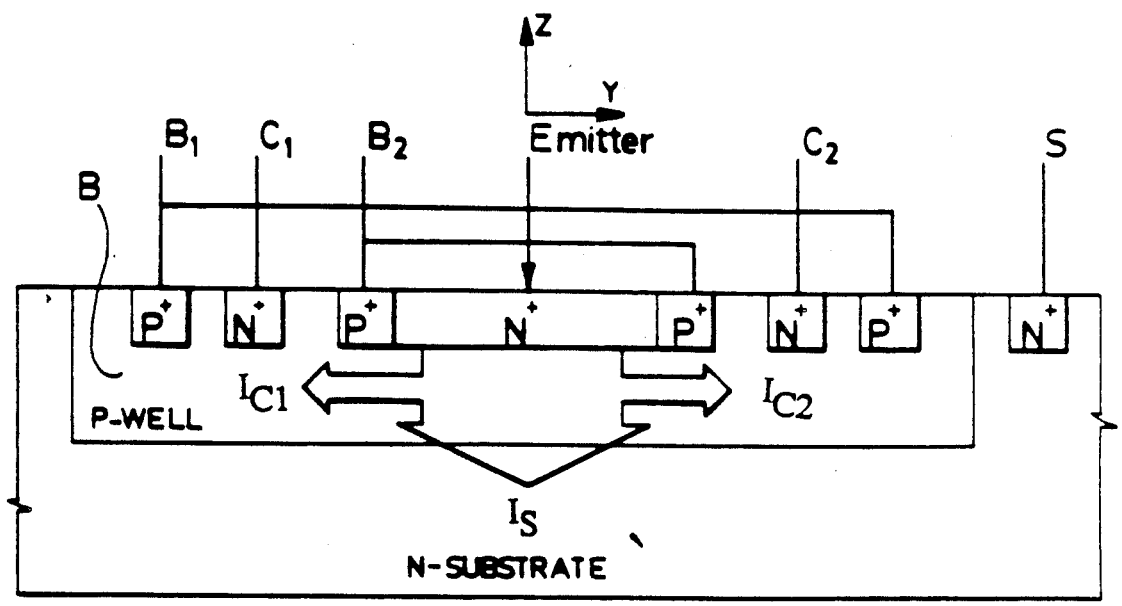
FIG. 2 is a view along the lines 2—2 of FIG. 1 diagrammatically showing minority carrier current flows in the absence of magnetic fields.

It should be noted that in the drawings common reference characters have in instances been used to designate both regions of the magnetotransistor and contacts which engage those regions.

DESCRIPTION OF A PREFERRED EMBODIMENT

Reference is made to FIGS. 1-4 which illustrate a magnetotransistor embodying various aspects of the present invention.

The magnetotransistor may be seen to comprise an N-type substrate which constitutes one collector of the device, the collector being associated with a contact terminal or region S of enhanced conductivity defined by an N+ diffusion in the substrate. A p-well forms a junction with the collector and constitutes a base region B where minority carriers flows are subjected to magnetic fields. An N+ region formed centrally in an upper surface of the device defines an emitter E and a base-emitter junction. Minority carries are injected from the emitter E into the base region B along an injection axis (the z-axis of FIGS. 2-4) and the larger part of these minority carrier flows are received by the substrate collector S which is in-line with or intersected by the injection axis. Two P+ base stripes $B_2$ form PN junctions on laterally opposing sides of the emitter region E which inhibit lateral injection.

Two N+ stripes are formed to laterally opposing sides of the emitter E, spaced from both the emitter E and the base stripes $B_2$ by portions of the base region B. These stripes constitute a pair of collectors $C_1$ and $C_2$ which form junctions with the base region B at which minority carrier flows branching from the flows injected towards the substrate collector are received. A pair of P+ base contact stripes $B_1$ are formed in the base region B. Each is associated with one of the collectors $C_1$ and $C_2$ and spaced laterally outwardly relative to the associated collector. The base strips $B_1$ are engaged by separate contacts and each can consequently be separately biased relative to the emitter E to permit different quiescent current levels to be established for the pair of collectors $C_1$ and $C_2$, if desired.

The magnetotransistor illustrated in the drawings is fabricated using standard 4 micron CMOS technology. The p-well diffusion depth is 10 microns; collector and emitter diffusion depths are 1.5 microns. Characteristic dimensions are presented in FIGS. 1 and 2.

The P+ stripes $B_2$ surrounding the emitter E and separating the emitter E from the collectors $C_1$ and $C_2$ play a very significant role in enhancing device sensitivity. First, they suppress carrier injection from the emitter E in the lateral direction towards the collectors $C_1$ and $C_2$. Second, by applying a reverse potential to these stripes $B_2$ with respect to the emitter E, it is possible to focus carrier injection from the emitter E into the base B at the bottom surface of the base-emitter junction. Third, applying a reverse potential to these stripes $B_2$ with respect to the emitter E creates a lateral electric field in the neutral base region. Because of the above three actions, it is possible to achieve both very high sensitivity and also linear response to magnetic fields.

Figure 5:
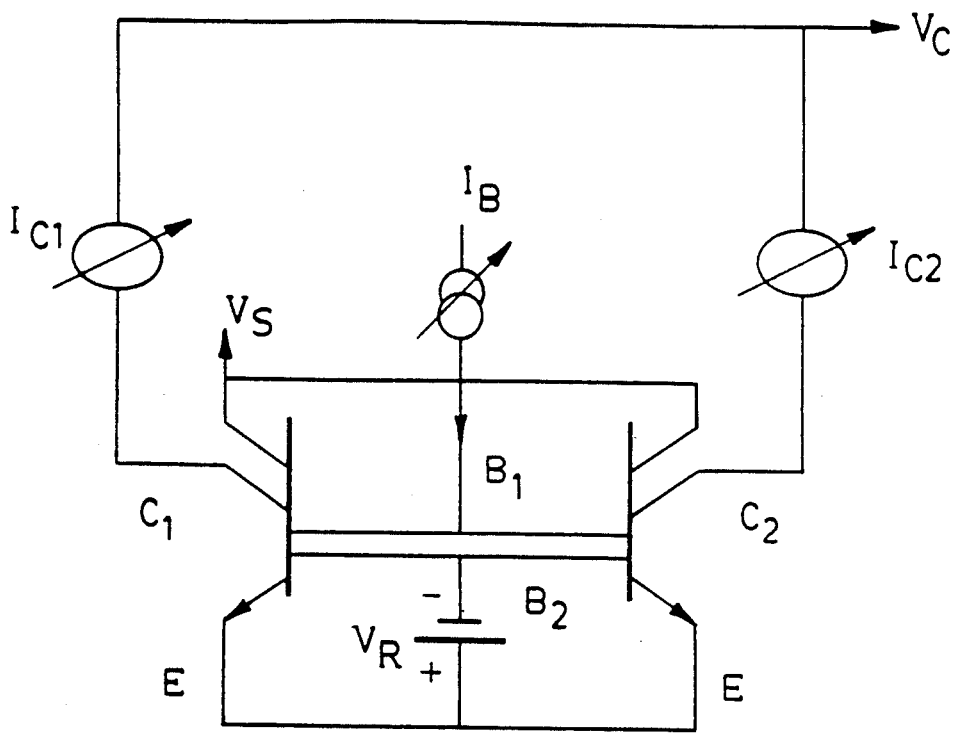
FIG. 5 is a schematic representation of the magnetotransistor in a first biasing arrangement.

A first biasing arrangement for the magnetotransistor is shown in FIG. 5. The device is supplied with a constant base current $I_B$. The values of the base current $I_B$, the voltage $V_C$, the voltage $V_S$ applied to the substrate, and $V_R$ applied between the base-emitter junctions associated with the base contact stripes $B_2$ determine the working point in the forward active region.

The device operation is as follows. In the forward active region, electrons are injected from the emitter E into the base B. If the base stripes $B_2$ are connected to the emitter E ($V_R=0$) or are placed at a negative potential with respect to the emitter E, the injection is restricted to the bottom surface of the emitter E. Part of the injected electrons are collected by the N-type substrate and part of them by the left and right collector stripes $C_1$ and $C_2$. In the absence of a magnetic field, the quiescent collector current levels are ideally equal because of device symmetry. The resulting current flows are diagrammatically illustrated in FIG. 2.

Figure 3:
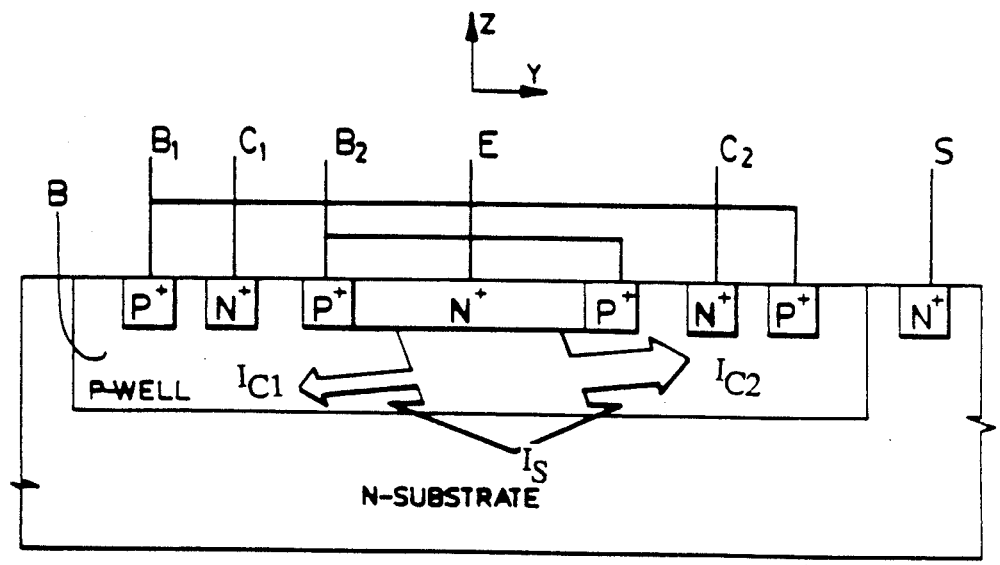
FIGS. 3 and 4 are views similar to that of FIG. 2 diagrammatically illustrating the distribution of minority carrier current flows in response to magnetic fields under different biasing conditions.
Figure 4:
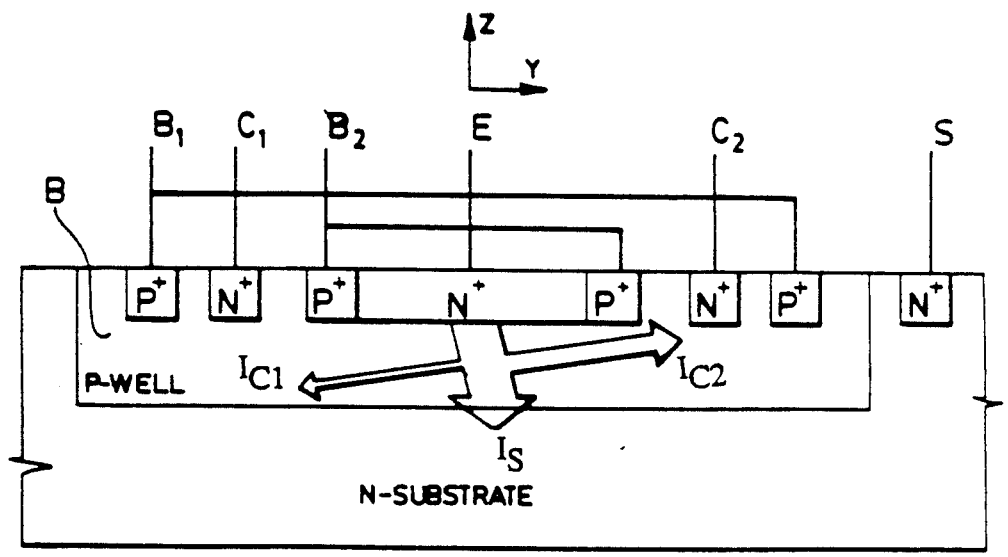

When a magnetic field is applied parallel to the chip surface (in the x-direction) an imbalance arises in the collector currents, an arrangement which is diagrammatically represented in FIG. 3. The Lorentz force is believed to act on the substrate current component $I_S$, the one collector current component $I_{C1}$, and other collector current component $I_{C2}$ substantially as follows. The current $I_S$ is deflected in the y-direction, contributing to an increasing of the current $I_{C2}$ and a decreasing of the current $I_{C1}$ (first deflection). At the same time the currents $I_{C1}$ and $I_{C2}$, themselves, are deflected in "$-Z$" and "$+Z$" direction, respectively (a second deflection) causing a further increasing of $I_{C2}$ and decreasing of $I_{C1}$ (because $I_{C2}$ is deflected toward the collector $C_2$ and $I_{C1}$ is deflected away from collector $C_1$).

This is possible in part because of the axial position of the two collectors $C_1$ and $C_2$ relative to the emitter E. In the embodiment illustrated in FIGS. 1-4, the bottom surface of the emitter E are substantially level with the bottom surfaces of the collector $C_1$ and $C_2$. Accordingly, the injected minority carriers, must travel through the base B both laterally and reverse to the direction of injection to reach each of the pair of collectors $C_1$ and $C_2$. When the field direction is reversed, $I_{C1}$ increases and $I_{C2}$ decreases. There appears inherent in this arrangement a "double-deflection mechanism."

When $V_R=0$, a larger area of the bottom of the emitter E injects electrons and the deflection of the current $I_S$ appears to be the dominant factor in the producing a noticeable response to magnetic fields. With an increasing of the negative potential on the base stripes $B_2$, with respect to the emitter E, the injection is focussed to the center of the bottom emitter surface forming a "beam" of electrons, as in FIG. 4. This beam is again split into three current components $I_S$, $I_{C1}$, and $I_{C2}$. Since the lateral path under the emitter E for $I_{C1}$ and $I_{C2}$ is now effectively longer (from the center of the emitter E towards the collectors), the second deflection mechanism is believed to play a more significant role in redistributing current flows between the two collectors $C_1$ and $C_2$. These mechanisms are believed to be responsible for an increase in sensitivity of more than one order of magnitude observed in an experimental version of the magnetotransistor.

Figure 7:
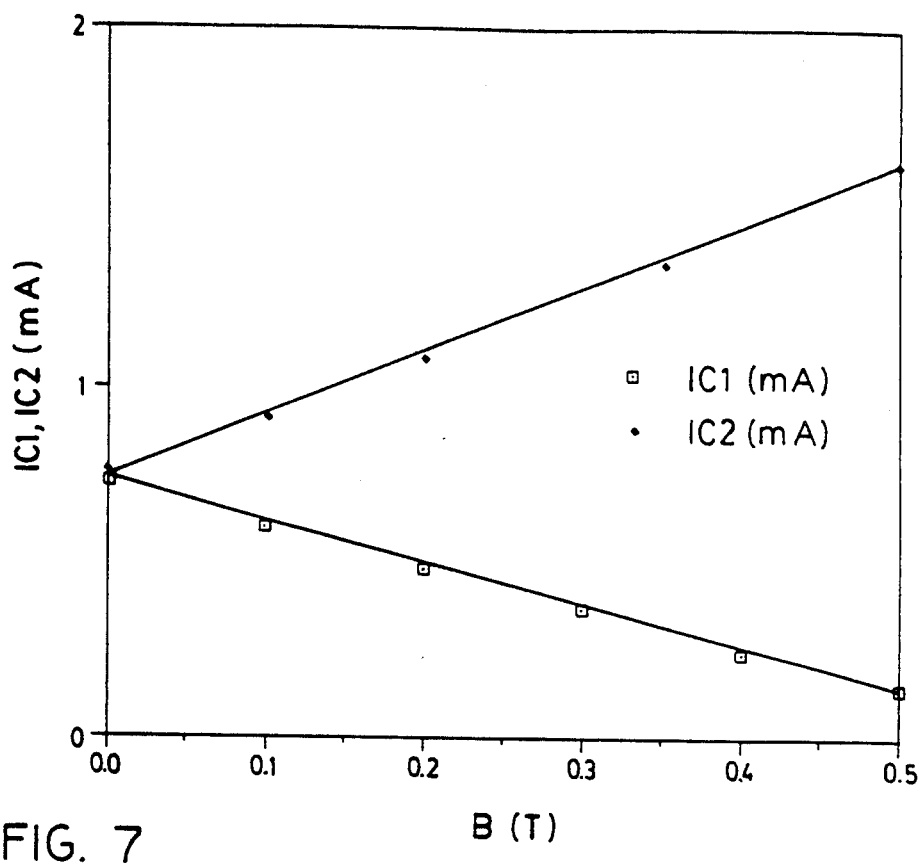
FIGS. 7 and 8 are graphs illustrating how certain collector currents indicative of magnetic field strength vary as a result of appropriate biasing of the device.
Figure 8:
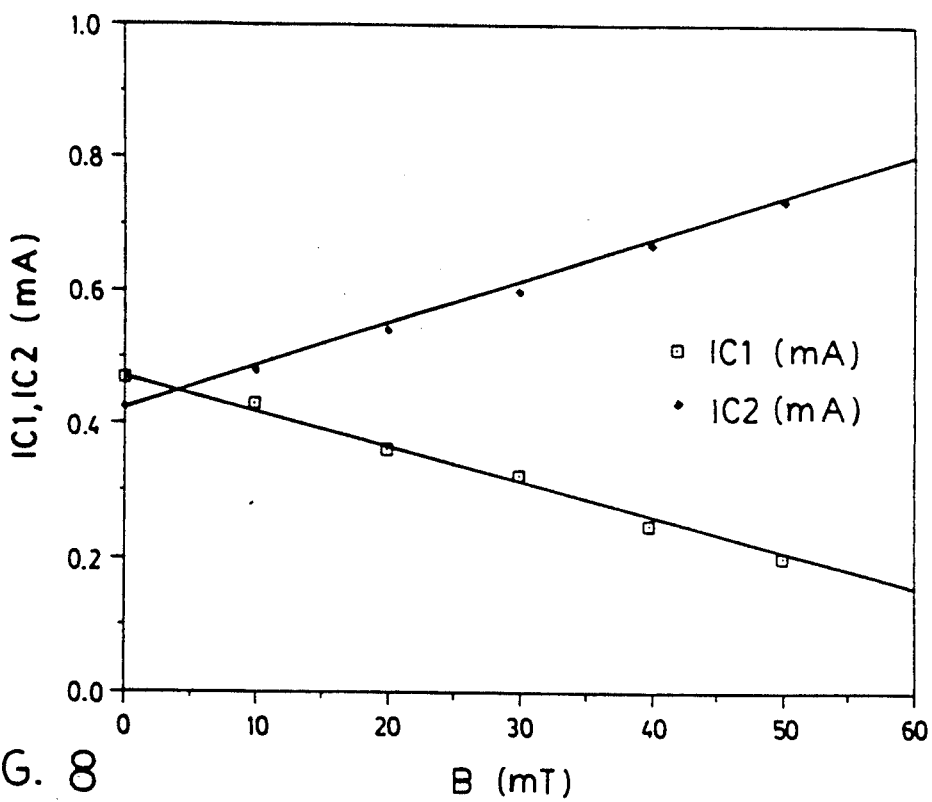

The significance of applying a negative voltage to the stripes $B_2$ will be apparent by comparing the change in the two collector currents $I_{C1}$ and $I_{C2}$ due to a magnetic field for two cases, when $V_R=0$ and when $V_R$ is at some negative value. Typical behavior of the collector currents as a function of the magnetic induction is shown in FIG. 7 ($V_R=0$) and FIG. 8 ($V_R=-0.1$ V). First, it should be noted that the collector currents vary linearly with the magnetic induction for both cases. Second, even for $V_R=0$, the measured relative sensitivity, $S_r=184\%/T$, is one of the highest reported for an magnetotransistor. The relative change of the collector currents, $I_{C2}-I_{C1}$, for this case is 1.5 mA at a magnetic field intensity of 0.5 T, which represents an extremely useful signal. Third, the application of a negative potential to the base stripes $B_2$ leads to an increase in the relative sensitivity to $1267\%/T$, which is an increase of more than one order of magnitude when compared with the case of $V_R=0$. To the knowledge of the inventors, this represents the highest sensitivity ever achieved with an magnetotransistor based on the deflection mechanism.

Two factors are considered particularly important in contributing to such high sensitivities: focussing of the injected minority carriers by reverse biasing the base stripes $B_2$ relative to the emitter E and the doubledeflection mechanism. Investigations have shown that the device can be operated as a highly sensitive magnetotransistor with a linear response to the magnetic field, achieving a sensitivity of up to $2000\%/T$. This can be achieved by the adjustment of two parameters, namely, the base current $I_B$ and the negative potential applied to $B_2$. At the same time, changing these two parameters independently, it is possible to create a whole variety of DC working points for the collector currents. This characteristic is extremely important for different circuitry applications.

The magnetotransistor structure appears also to be very attractive for switching in response to magnetic fields. When a magnetic field is applied, it is possible to drive one of the collector currents down to zero. The point at which collector current approaches zero is commonly called the "blocking point."

Another important aspect of the performance of this magnetic field sensor is the minimum intensity of the magnetic field that can be detected. Mismatches in such types of devices, due to limitations in fabrication techniques, tend to produce a current offset between the collect currents $I_{C1}$ and $I_{C2}$ in the absence of any magnetic field. During actual measurement of magnetic field intensities, this offset is indistinguishable from a useful signal. In many magnetic field sensors, this type of DC error is the basic limitation on the resolution of the sensor and represents a critical problems for designers.

Figure 6:
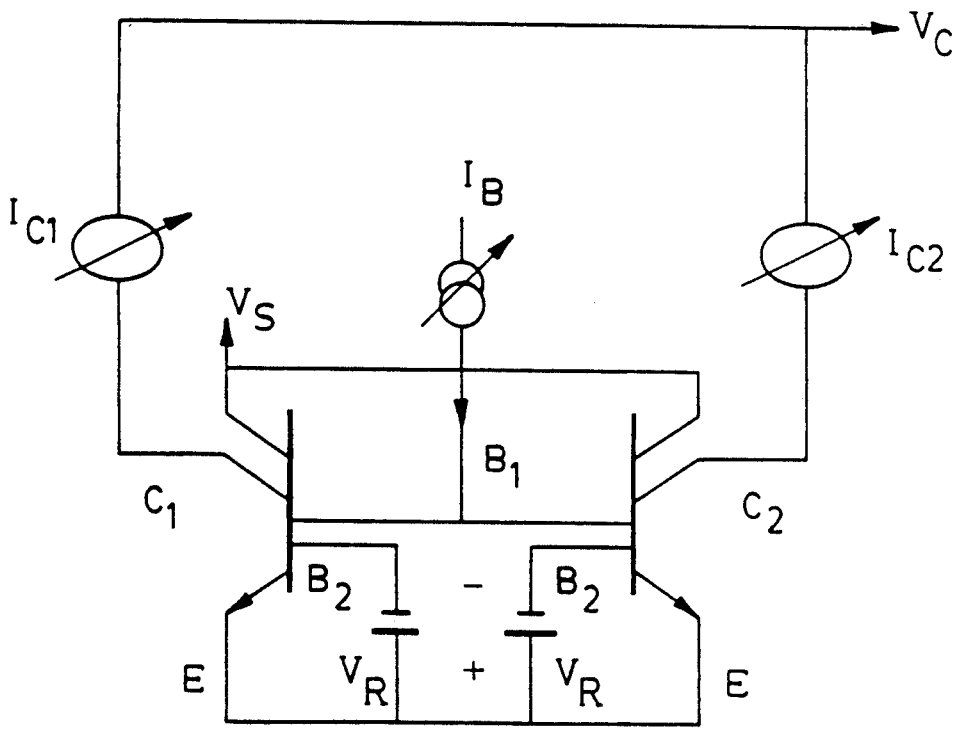
FIG. 6 is a schematic representation of the magnetotransistor in a second biasing arrangement.

This problem is conveniently solved in the magnetotransistor structure described herein. Because carrier injection from the emitter E is focussed to the bottom center of the base-emitter junction, the center of injection can be displaced towards one of the two laterally spaced-apart collectors $C_1$ and $C_2$. This can be done by applying different negative potentials to the base stripes $B_2$ as in the biasing arrangement of FIG. 6. This procedure enables one to adjust both quiescent collector currents to be equal and to avoid the offset problem.

It will be appreciated that a particular magnetotransistor structure has been described for purposes of illustrating the various features and principles of the invention and that many of the features and operating principles may be embodied in semiconductor magnetic field sensors of different configuration. The injection mechanism described herein and the techniques for suppression of parasitic injection currents may be used in a variety of semiconductor devices to focus minority carriers and to eliminate parasitic currents and should not be regarded as limited to devices of the type described herein.

We claim:

1. A device for use in measuring the intensity of a magnetic field, the device comprising semiconductor material defining:
   a conduction region;
   an injection region forming a junction with the conduction region, the injection region permitting injection of minority carriers into the conduction region along an injection axis through the junction;
   injection suppressing regions on at least laterally opposing sides of the injection region and forming junctions with the injection region having depletion zones, the injection suppressing regions suppressing injection of minority carriers laterally relative to the injection axis;
   a plurality of distinct collection regions forming junctions with the conduction region where minority carriers injected into the conduction region can be received, the collection regions being spaced from the injection region and offset laterally from the injection axis such that magnetic field components transverse to the injection axis redistribute injected minority carrier flows between the plurality of collection regions in proportion to the magnitude of the magnetic field components; and,
   electrical contacts engaging the injection region and the injection suppressing regions such that the junctions between the injection region and each of the injection suppressing regions can be reverse biased.

2. A device as claimed in claim 1 in which the electrical contacts separately engage each of the injection suppressing regions such that different voltage potentials can be selectively applied across each of the junctions between the injection region and the injection suppressing regions to shift the injection axis relative to the plurality of collection regions.

3. A device as claimed in claim 2 in combination with biasing means for applying the different voltage potentials across the junctions between the injection region and each of the injection suppressing regions.

4. A device as claimed in claim 1 comprising another collection region distinct from the plurality of collection regions, the other collection region forming a junction with the conduction region where minority carriers injected into the conduction region can be received, the junction between the conduction region and the other collection region being intersected by the injection axis.

5. A device as claimed in claim 4 in which the plurality of collection regions are so positioned axially relative to the injection region that, once injected into the conduction region along the injection axis, the injected minority carriers must travel through the conduction region both laterally and reverse to the direction of injection to reach each of the plurality of collection regions.

6. In a semiconductor device for measurement of magnetic fields by deflection of minority carrier flows in a conduction region, improved means for injecting minority carriers into the conduction region, comprising:
- an injection region forming a junction with the conduction region, the injection region permitting injection of minority carriers into the conduction region along an injection axis;
- injection suppressing regions on at least opposing sides of the injection region and forming junctions with the injection region having depletion zones, the injection region suppressing injection of minority carriers laterally relative to the injection axis; and,
- electrical contacts engaging the injection region and the injection suppressing regions such that the junctions between the injection region and each of the injection suppressing regions can be reverse biased.

7. Improved means for injecting minority carriers as claimed in claim 6 in which the electrical contacts separately engage each of the injection suppressing regions such that different voltage potentials can be selectively applied across each of the junctions between the injection region and the injection suppressing regions to shift the injection axis relative to the plurality of collection regions.

8. Improved means for injecting minority carriers as claimed in claim 7 in association with biasing means for applying the different voltage potentials across the junctions between the injection region and each of the injection suppressing regions can be reverse biased.

9. A device for use in measuring the intensity of a magnetic field, the device comprising semiconductor material defining:
- a base;
- an emitter forming a junction with the base, the emitter injecting minority carriers into the base region along an injection axis through the base-emitter junction;
- injection suppressing base strips on at least laterally opposing sides of the emitter forming junctions with the emitter having depletion zones which suppress injection of minority carriers laterally relative to the injection axis; and,
- a pair of collectors forming junctions with the base region, the collectors being spaced from the emitter and positioned to laterally opposing sides of and offset from the injection axis, whereby, magnetic field components transverse to the injection axis redistribute injected minority carrier flows between the pair of collectors in response to the magnitude of the magnetic field components;
- a third collector forming a junction with the base where minority carriers injected into the base can be collected, the junction between the third collector and the base being intersected by the injection axis;
- a pair of base contact strips formed in the base, one of the pair of base contact strip being associated with each of the pair of collectors;
- electrical contacts engaging the emitter, the base, the injection suppressing base strips, the pair of collectors, the third collector, and each of the base contact strips;
- the electrical contacts being arranged such that the junctions between the emitter and each of the injection suppressing base strips can be reverse biased and such that each of the base strips can be biased relative to the emitter to set a quiescent current level through each of the pair of collectors.

10. A device as claimed in claim 9 in which the electrical contacts separately engage each of the injection suppressing base strips so that different voltage potentials can be selectively applied across each of the junctions between the emitter and the injection suppressing base strips to shift the injection axis laterally relative to the pair of collectors.

11. A device as claimed in claim 10 in which the electrical contacts separately engage each of the base contact strips such that each of the base contact strips can be biased separately relative to the emitter to establish different quiescent current levels in each of the pair of collectors.

12. A device as claimed in claim 11 in which the pair of collectors are so located axially relative to the emitter that, once injected into the base along the injection axis, the injected minority carriers must travel through the base both laterally and reverse to the direction of injection to reach each of the pair of collectors.

13. Means for injecting minority carriers along an injection axis into a semiconductor conduction region, comprising:
- an injection region forming a junction with the conduction region, the junction being formed about the injection axis;
- injection suppressing regions on at least laterally opposing sides of the injection region and forming junctions with the injection region having depletion zones, the injection region suppressing injection of minority carriers laterally relative to the injection axis:
- means for reverse biasing the junctions between the injection region and the injection suppressing regions to varying degrees such that the injection of minority carriers can be focused along the injection axis to varying degrees.

14. Injection means as claimed in claim 13 comprising means for permitting each of the junctions between the injection region and the injection suppressing regions to be separately reversed biased to different degrees such that the injection region can be shifted laterally.

* * * * *